United States Patent
Wakayama et al.

(10) Patent No.: US 9,296,925 B2
(45) Date of Patent: Mar. 29, 2016

(54) FILM-LIKE ADHESIVE, ADHESIVE SHEET FOR SEMICONDUCTOR JUNCTION, AND METHOD FOR PRODUCING SEMICONDUCTOR DEVICE

(71) Applicant: LINTEC Corporation, Tokyo (JP)

(72) Inventors: Yoji Wakayama, Tokyo (JP); Isao Ichikawa, Tokyo (JP); Takashi Akutsu, Tokyo (JP)

(73) Assignee: LINTEC Corporation, Tokyo (JP)

( * ) Notice: Subject to any disclaimer, the term of this patent is extended or adjusted under 35 U.S.C. 154(b) by 0 days.

(21) Appl. No.: 14/418,661

(22) PCT Filed: Aug. 2, 2013

(86) PCT No.: PCT/JP2013/070990
§ 371 (c)(1),
(2) Date: Apr. 15, 2015

(87) PCT Pub. No.: WO2014/021450
PCT Pub. Date: Feb. 6, 2014

(65) Prior Publication Data
US 2015/0225613 A1  Aug. 13, 2015

(30) Foreign Application Priority Data

Aug. 2, 2012  (JP) .................................. 2012-172290

(51) Int. Cl.
| H01L 23/48 | (2006.01) |
|---|---|
| H01L 23/52 | (2006.01) |
| H01L 29/40 | (2006.01) |
| C09J 7/02 | (2006.01) |
| C09J 163/00 | (2006.01) |
| C08F 220/18 | (2006.01) |
| C08G 18/75 | (2006.01) |
| C08G 18/80 | (2006.01) |

(Continued)

(52) U.S. Cl.
CPC ............. *C09J 7/0235* (2013.01); *C08F 220/18* (2013.01); *C08G 18/10* (2013.01); *C08G 18/755* (2013.01); *C08G 18/8029* (2013.01); *C09J 7/0239* (2013.01); *C09J 133/00* (2013.01); *C09J 133/068* (2013.01); *C09J 133/14* (2013.01); *C09J 163/00* (2013.01); *C09J 175/16* (2013.01); *H01L 21/78* (2013.01); *H01L 24/27* (2013.01); *H01L 24/29* (2013.01); *H01L 24/32* (2013.01); *H01L 24/81* (2013.01); *H01L 24/83* (2013.01); *H01L 24/92* (2013.01); *C09J 2201/622* (2013.01); *C09J 2203/326* (2013.01); *C09J 2433/00* (2013.01); *C09J 2463/00* (2013.01); *H01L 21/6836* (2013.01); *H01L 24/13* (2013.01); *H01L 24/16* (2013.01); *H01L 24/73* (2013.01); *H01L 24/94* (2013.01); *H01L 2221/68336* (2013.01); *H01L 2224/131* (2013.01); *H01L 2224/13014* (2013.01); *H01L 2224/13111* (2013.01); *H01L 2224/13147* (2013.01); *H01L 2224/16225* (2013.01); *H01L 2224/16245* (2013.01); *H01L 2224/271* (2013.01); *H01L 2224/27003* (2013.01); *H01L 2224/27334* (2013.01); *H01L 2224/2929* (2013.01); *H01L 2224/2939* (2013.01); *H01L 2224/29387* (2013.01); *H01L 2224/32221* (2013.01); *H01L 2224/32225* (2013.01); *H01L 2224/32245* (2013.01); *H01L 2224/73104* (2013.01); *H01L 2224/8113* (2013.01); *H01L 2224/81191* (2013.01); *H01L 2224/81203* (2013.01); *H01L 2224/81815* (2013.01); *H01L 2224/8385* (2013.01); *H01L 2224/83191* (2013.01); *H01L 2224/83192* (2013.01); *H01L 2224/83203* (2013.01); *H01L 2224/83856* (2013.01); *H01L 2224/83862* (2013.01); *H01L 2224/92* (2013.01); *H01L 2224/9211* (2013.01); *H01L 2224/9212* (2013.01); *H01L 2224/94* (2013.01); *H01L 2225/06513* (2013.01); *H01L 2924/069* (2013.01); *H01L 2924/01322* (2013.01); *H01L 2924/0635* (2013.01); *H01L 2924/0665* (2013.01); *H01L 2924/12042* (2013.01); *H01L 2924/12044* (2013.01); *Y10T 428/1405* (2015.01)

(58) Field of Classification Search
CPC .............. H01L 2924/0665; H01L 2224/8385; H01L 207/782; H01L 2324/2939; H01L 23/295; H01L 224/92052
USPC ........................ 257/782, 783; 438/118, 119
See application file for complete search history.

(56) References Cited

U.S. PATENT DOCUMENTS

| 6,139,953 A | 10/2000 | Nagamoto et al. |
| 2010/0129045 A1 | 5/2010 | Shibata et al. |

(Continued)

FOREIGN PATENT DOCUMENTS

| JP | 9253964 A | 9/1997 |
| JP | 2003171475 A | 6/2003 |

(Continued)

OTHER PUBLICATIONS

Notification of Transmittal of Translation of International Preliminary Report on Patentability, dated Feb. 12, 2015.
International Search Report, International Application No. PCT/JP2013/070990, dated Oct. 22, 2013.
English Abstract of JP 2010074144.

(Continued)

*Primary Examiner* — S. V. Clark
(74) *Attorney, Agent, or Firm* — Cahn & Samuels, LLP

(57) ABSTRACT

A film is obtained by forming a film of and curing an energy ray-curable composition including a polymerizable silicone compound and an energy ray-curable resin having a viscosity at 25° C. of 100-5,000,000 mPa·S.

9 Claims, No Drawings

(51) Int. Cl.
*C08G 18/10* (2006.01)
*C09J 133/06* (2006.01)
*C09J 175/16* (2006.01)
*C09J 133/14* (2006.01)
*C09J 133/00* (2006.01)
*H01L 21/78* (2006.01)
*H01L 23/00* (2006.01)
*H01L 21/683* (2006.01)

(56) References Cited

U.S. PATENT DOCUMENTS

| | | | | |
|---|---|---|---|---|
| 2012/0231236 | A1* | 9/2012 | Shishido | H01L 21/6836 428/195.1 |
| 2012/0267803 | A1 | 10/2012 | Lee et al. | |
| 2013/0251990 | A1* | 9/2013 | Higashi | C09J 133/066 428/355 AC |
| 2014/0065414 | A1 | 3/2014 | Tamura et al. | |
| 2014/0079947 | A1 | 3/2014 | Tamura et al. | |
| 2014/0295646 | A1* | 10/2014 | Shinoda | C09J 201/00 438/464 |
| 2015/0270188 | A1* | 9/2015 | Morita | C08L 33/00 438/113 |
| 2015/0357223 | A1* | 12/2015 | Takamoto | H01L 21/6836 257/778 |

FOREIGN PATENT DOCUMENTS

| | | |
|---|---|---|
| JP | 2008260908 A | 10/2008 |
| JP | 2010074144 A | 4/2010 |
| JP | 2011171688 A | 9/2011 |
| WO | 2011040064 A1 | 4/2011 |

OTHER PUBLICATIONS

English Abstract of JP 2008260908.
English Abstract of WO 2011040064.
English Abstract of JP 2003171475.
English Abstract of JP 09253964.
English Abstract of JP 2001171688.

* cited by examiner

FILM-LIKE ADHESIVE, ADHESIVE SHEET FOR SEMICONDUCTOR JUNCTION, AND METHOD FOR PRODUCING SEMICONDUCTOR DEVICE

This application is a U.S. national stage application of PCT/JP2013/070990 filed on 2 Aug. 2013, and claims priority to Japanese patent document 2012-172290 filed on 2 Aug. 2012, the entireties of which are incorporated herein by reference.

TECHNICAL FIELD

The present invention relates to a film-like adhesive particularly suitable to be used at a step (die-bonding) of adhering a semiconductor chip to organic substrate or lead flame or other semiconductor chip, and also relates to an adhesive sheet for semiconductor junction and a method for producing semiconductor device using said film-like adhesive and said adhesive sheet.

DESCRIPTION OF THE RELATED ART

The semiconductor wafer of silicon or gallium arsenide or so is produced in a state of large diameter, and this wafer is cut and diced (dicing) to element piece (the semiconductor chip), then it is transferred to a mounting step which is the subsequent step. At this time, the backside of the semiconductor wafer is thinned by the grinding step, and it is adhered to the adhesive sheet then each step of dicing, washing, drying, expanding and picking up are carried out, then it is transferred to the bonding step which is the subsequent step.

During the bonding step, in case of mounting the semiconductor chip to the print wiring substrate, the conductive projections (bump electrode) made of eutectic solder, high temperature solder, and gold or so is formed to the connection pad parts of the circuit face side of the semiconductor chip, and by so called "face down method", the flip chip mounting method wherein these bump electrodes are opposed or are made into contact with the corresponding terminal part on the chip mounting substrate, then melting/diffuse bonding may be employed. To such mounting method, by using the die attachment film which has been widely used recently, wherein the chip is obtained by dicing the wafer while still adhered to the wafer and used for the adhesive film of adhering the chip and the chip mounting substrate during the die bonding, then it would be easier than other embodiment which uses the under fill material.

However, the following problem became apparent when employing the die attachment film to such mounting method. That is, for the flip chip mounting method, by optically reading the alignment mark formed on the circuit face of the semiconductor chip, it becomes possible to accurately die bond to the predetermined position. Therefore, when the adhesive film does not have sufficient transparency, there is a problem that the alignment mark becomes difficult to read.

The patent article 1 discloses the electronic component with adhesive film wherein the transmittance of light of the wavelength 440 nm to 770 nm is 74% or more. The adhesive film disclosed in here does not include the filler; however filler may be added in order to regulate the linear expansion coefficient of the adhesive film, or to suppress the moisture absorption property. When using the adhesive film as the die attachment film in the flip chip mounting method, the adhesive film is adhered to the surface side of the wafer; therefore the dicing may be carried out while not covered by the dicing sheet and being exposed. In such case, the exposed adhesive film is exposed to the washing water during the dicing. Therefore, it is demanded to add the filler to the adhesive film in order to control the moisture absorption property. By controlling the moisture absorption property, the water resistance of the adhesive film during the dicing or the package reliability of the obtained semiconductor device can be improved. However, due to the difference of the optical characteristic between other components constituting the adhesive film and the filler, the transparency of the adhesive film may decline. Therefore, due to the adhesive film attached to the circuit face of the semiconductor film, the reading property of the alignment may become insufficient.

PRIOR ART

Patent Article

Patent document 1: Patent Application Laid Open No. 2011-171688

SUMMARY OF THE INVENTION

Therefore, the object of the present invention is to provide the film-like adhesive and the adhesive sheet for the semiconductor junction using thereof, wherein the semiconductor chip can be die bonded accurately to the predetermined position during the flip mounting method, and also to produce the semiconductor device having high package reliability.

The present invention which solves the above objects includes the following gist.

[1] A film-like adhesive comprising a binder resin (A), an epoxy resin (B), a thermosetting agent (C) and a filler (D), wherein
a total light transmittance in D65 standard light source is 70% or more, and haze value is 50% or less.

[2] The film-like adhesive as set forth in [1] comprising 5 wt % or more of the filler (D).

[3] The film-like adhesive as set forth in [1] or [2], wherein an average particle diameter of the filler (D) is 50 nm or less.

[4] The film-like adhesive as set forth in any one of [1] to [3], wherein said binder resin (A) is an acrylic polymer comprising 5 to 30 wt % of constituting unit derived from epoxy group containing monomer.

[5] The film-like adhesive as set forth in any one of [1] to [4], wherein a content of the epoxy resin (B) is 50 to 1000 parts by weight with respect to 100 parts by weight of the binder resin (A).

[6] An adhesive sheet for semiconductor junction wherein the film-like adhesive as set forth in any one of [1] to [5] is formed as an adhesive layer on a support sheet in a releasable manner.

[7] The adhesive sheet for semiconductor junction as set forth in [6], wherein the support sheet comprises composite film made of urethane polymer and vinyl based polymer, or comprises cured urethane acrylate film as a constituting layer.

[8] A production method of a semiconductor device using the film-like adhesive as set forth in any one of [1] to [5] or the adhesive sheet for semiconductor junction as set forth in [6] or [7], wherein said production method comprises a step of adhering the film-like adhesive or the adhesive layer of the adhesive sheet for the semiconductor junction to a wafer, a step of obtaining a chip by dicing the wafer, and a step of fixing the chip via the film-like adhesive or the adhesive layer. According to the film-like adhesive of the present invention and the adhesive sheet for semiconductor junction using thereof, the flip chip method can be used, and the chips or the chip and the substrate can be adhered against each other by accurately determining the position. Also, even under the harsh environment, the semiconductor device showing high package reliability can be obtained.

DETAILED DESCRIPTION OF INVENTION

The film-like adhesive according to the present invention will be described first.
(The Film-Like Adhesive)

The film-like adhesive of the present invention comprises a binder resin (A), an epoxy resin (B), a thermosetting agent (C) and a filler (D) as essential components, and in order to improve various physical properties, other components may be included depending on the needs. Hereinbelow, each component will be explained specifically.

Binder Resin (A)

The binder resin is not particularly limited as long as it is polymer component which gives flexibility and film forming property to the film-like adhesive; however for example, acrylic polymer, polyester resin, polyvinyl alcohol resin, polyvinyl butyral, polyvinyl chloride, polystyrene, polyamide resin, cellulose, polyethylene, polyisobutylene, polyvinyl ether, polyimide resin, phenoxy resin, styrene-isoprene-styrene block copolymer, styrene-butadiene-styrene block copolymer or so may be mentioned. These binder resins may be used alone or by combining two or more thereof, however from the point of avoiding the decline of the transparency of the film-like adhesive due to the low compatibility against the different binder resins, it is preferable to use the alone. In case of using by combining two or more thereof, it is preferable to select those having similar compositions so that the compatibility does not decline. Among the above mentioned, acrylic polymer is preferably used due to various characteristic of the film-like adhesive, particularly of the easiness to regulate the compatibility between the binder resin and other components.

As the acrylic polymer, the conventionally known acrylic polymer can be used. The weight average molecular weight of the acrylic polymer is preferably 10,000 to 2,000,000, and more preferably 100,000 to 1,500,000. If the weight average molecular weight of the acrylic polymer is too low, the release force with the support sheet used for the adhesive sheet for semiconductor junction which will be described later becomes high, and the interlayer release malfunction between the adhesive layer made of the film-like adhesive and the support sheet may occur. Also, if the weight average molecular weight of the acrylic polymer is too high, the film-like adhesive cannot follow the bumps of the substrate and it may cause voids or so.

The glass transition temperature of the acrylic polymer is preferably −30 to 50° C., more preferably −10 to 40° C., and particularly preferably 0 to 30° C. If the glass transition temperature is too low, the interlayer release malfunction between the adhesive layer made of the film-like adhesive, and the support sheet may occur; and if it is too high, the adhesive force to fix the wafer may be insufficient.

Monomer constituting the acrylic polymer (the raw material monomer) comprises (meth)acrylic acid ester monomer as the essential component. As the specific example of (meth) acrylic acid ester monomer, (meth)acrylic acid alkyl ester having the carbon atoms of the alkyl group of 1 to 18 such as methyl (meth)acrylate, ethyl (meth)acrylate, propyl (meth) acrylate, butyl (meth)acrylate, pentyl (meth)acrylate, hexyl (meth)acrylate, heptyl (meth)acrylate, octyl (meth)acrylate, 2-ethylhexyl (meth)acrylate, nonyl (meth)acrylate, decyl (meth)acrylate, lauryl (meth)acrylate, tetradecyl (meth)acrylate, octadecyl (meth)acrylate or so; (meth)acrylic acid ester having cyclic backbone such as cycloalkyl (meth)acrylate, benzyl (meth)acrylate, isobornyl (meth)acrylate, dicyclopentanyl (meth)acrylate, dicyclopentenyl (meth)acrylate, dicyclopentenyloxyethyl (meth)acrylate, imide (meth)acrylate or so; hydroxyl group containing (meth)acrylic acid ester such as hydroxymethyl (meth)acrylate, 2-hydroxyethyl (meth) acrylate, 2-hydroxylpropyl (meth)acrylate, 2-hydroxybutyl (meth)acrylate or so; epoxy group containing (meth)acrylic acid ester such as glycidyl (meth)acrylate, 3,4-epoxycyclohexylmethyl (meth)acrylate or so; amino group containing (meth)acrylic acid such as monomethyl amino (meth)acrylate, monoethyl amino (meth)acrylate, diethylamino (meth) acrylate or so; and carboxyl group containing (meth)acrylic acid ester such as 2-(meth)acyloyloxyethyl phthalate, 2-(meth)acryloyloxy propyl phthalate or so may be mentioned. These may be used alone or by combining two or more.

Also, as the raw material monomer of the acrylic polymer, monomer comprising carboxylic group other than (meth) acrylic acid ester such as (meth)acrylic acid or itaconic acid or so, monomer comprising hydroxyl group of other than (meth) acrylic acid ester such as vinyl alcohol, N-methylol(meth) acrylic amide or so, (meth)acrylic amide, vinyl acetate, acrylonitrile and styrene or so may be used together with (meth) acrylate monomer.

Also, as the monomer constituting the acrylic polymer, it is preferable to at least use the epoxy group containing monomer since the acrylic polymer having good compatibility with epoxy resin (B) can be obtained. In this case, for acrylic polymer, the constituting unit derived from the epoxy group containing monomer is preferably included within the range of 5 to 30 wt %, and more preferably 10 to 25 wt %. By acrylic polymer comprising the epoxy group containing monomer as the constituting unit within such range, it becomes easy to avoid the decline of the transparency of the film-like adhesive caused by the decline of the compatibility between the acrylic polymer and epoxy resin (B). As epoxy group containing monomer, besides the above mentioned epoxy group containing acrylic acid ester, glycidyl vinyl ether, 3,4-epoxycyclohexyl vinyl ether, glycidyl (meth)allyl ether, 3,4-epoxycyclohexyl (meth)allyl ether or so may be mentioned.

Also, the acrylic polymer may comprise the constituting unit derived from the monomer comprising active hydrogen such as hydroxyl group containing (meth)acrylic acid ester, amino group containing (meth)acrylic acid ester, (meth) acrylic acid or so. Thereby, by blending the crosslinking agent (I) which will be explained in below to the film-like adhesive, the acrylic polymer can be crosslinked, and the initial adhesive force and aggregation property of the film-like adhesive can be controlled. In this case, the constituting unit derive from the monomer comprising the active hydrogen is preferably included within the range of 1 to 30 wt % or so.

The acrylic polymer can be produced by using the above mentioned raw material monomer in accordance with the conventionally known methods.

Epoxy Resin (B)

As for epoxy resin (B), the conventionally known various epoxy resins can be used. As for epoxy resin, epoxy resin having 2 or more of functional groups in the structural unit such as bisphenol A type epoxy resin, bisphenol F type epoxy resin, phenylene back bone type epoxy resin, phenol novolak type epoxy resin, cresol novolak type epoxy resin, dicyclopentadiene type epoxy resin, biphenyl type epoxy resin, triphenolmethane type epoxy resin, heterocyclic type epoxy resin, stilbene type epoxy resin, condensed aromatic hydrocarbon modified epoxy resin, or halide thereof may be mentioned. Also, those comprising unsaturated hydrocarbon groups may be used as well. Such epoxy resins are disclosed in Patent article Laid Open No. 2008-133330. The epoxy equivalent of the epoxy resin is not particularly limited, however it is preferably 150 to 250 (g/eq). Note that, the epoxy equivalent is a value measured according to the JIS K7236:2001. These epoxy resins may be used alone, or by combining two or more.

For the film-like adhesive of the present invention, the content of epoxy resin (B) is preferably 50 to 1000 parts by weight, more preferably 100 to 600 parts by weight, and more preferably 150 to 400 parts by weight with respect to 100 parts by weight of binder resin (A). By having the content of epoxy resin (B) within said range, the film-like adhesive becomes to B stage state as epoxy resin (B) partially cures due to the heat during the solder heating at the step of mounting the flip chip to the substrate, thus it becomes easy to prevent the solder from flowing out. Also, if the content of epoxy resin (B) exceeds said range, the release force between the film-like adhesive and the support sheet becomes too high, which may cause interlayer release malfunction of the support sheet and the adhesive layer made of the film-like adhesive.

Thermosetting Agent (C)

The thermosetting agent (C) functions as the thermosetting agent against epoxy resin (B). As for thermosetting agent (C), a compound having 2 or more functional groups which can react with the epoxy group within the molecule may be mentioned. As the functional groups capable of reacting with the epoxy group, phenolic hydroxyl group, alcoholic hydroxyl group, amino group, carboxyl group, acid anhydride group or so may be mentioned. Among these, the functional groups derived from phenolic hydroxyl group, amino group, acid anhydride group are preferable, and the phenolic hydroxyl group and amino group are more preferable.

As the thermosetting agent (C), phenolic thermosetting agent such as novolak type phenol resin, dicyclopentadiene type phenol resin, polyfunctional type phenol resin, aralkyl phenol resin or so; the amine type thermosetting agent such as DICY (dicyandiamide) or so may be mentioned. Also, the thermosetting agent comprising unsaturated hydrocarbon group may be used as well. For example, the resin comprising unsaturated hydrocarbon group and functional group capable of reacting with epoxy group may be used as the thermosetting agent comprising unsaturated hydrocarbon group, such as disclosed in Patent article Laid Open No. 2008-248129. The thermosetting agent (C) may be used alone or by mixing two or more.

For the film-like adhesive of the present invention, the content of the thermosetting agent (C) is usually 0.1 to 500 parts by weight, preferably 1 to 200 parts by weight and more preferably 10 to 100 parts by weight with respect to 100 parts by weight of epoxy resin (B). If the content of the thermosetting agent (C) is below the above mentioned range, the curability may be insufficient, and the film-like adhesive having sufficient adhesive force may not be obtained.

Filler (D)

By blending the filler (D) to the film-like adhesive, the linear expansion coefficient of the film-like adhesive can be regulated in some cases. Also, it is possible to lower the moisture absorption rate of after the curing of the film-like adhesive. By reducing the moisture absorption rate, the reliability of the semiconductor package can be improved. The filler may be any of so called inorganic filler or organic filler; however from the point of the heat resistance, inorganic filler is preferably used.

As the material of filler, silica, alumina, calcium carbonate, calcium silicate, magnesium hydroxide, aluminum hydroxide, titanium oxide, carbon black, talc, mica or clay or so may be mentioned. Among these, silica is preferable as the transparency and the dispersibility are good, and those with small average particle diameter can be obtained easily. The filler may be used alone, or by combining two or more thereof. Silica as the filler may be surface modified by organic compounds. As the organic compound used for the surface modification of filler (for example silica), those comprising unsaturated hydrocarbon of (meth)acryloyl group or so may be mentioned. As the organic compound used for the surface modification comprises the unsaturated hydrocarbon group, in case other component comprising unsaturated hydrocarbon group is comprised in the film-like adhesive, the filler and other component can form a bond therebetween, and the compatibility between the filler and other component can be improved. As a result, the total light transmittance or haze value of the film-like adhesive can be easily controlled, and also the semiconductor chip can be bonded to other semiconductor chip or to the substrate by excellent adhesive strength via the film-like adhesive.

The content of the filler (D) in the film-like adhesive agent is preferably 5 wt % or more, more preferably 5 to 50 wt %, and particularly preferably 10 to 30 wt % with respect to entire solid portion constituting the film-like adhesive. By having the content of the filler (D) within the above mentioned range, the moisture absorption after the curing of the film-like adhesive can be further reduced, and the ratio of the filler in the film-like adhesive does not become excessively large, thus the adhesiveness is unlikely to be lost.

The average particle diameter of the filler (D) is preferably 50 nm or less. By having the average particle diameter of the filler (D) within the above mentioned range, the film-like adhesive can adhere without compromising the adhesiveness between the adherend such as wafer or so. Also, it becomes easy to regulate the haze value or the total light transmittance of the following described film-like adhesive within the desired range. The reason why such effect can be obtained is thought as follows. Even when the filler having the average particle diameter which is smaller than the wavelength (the lower limit is 360 nm or so) of the visible light is used, the scattering of the visible light so called Rayleigh scattering cannot be avoided. However, when the average particle diameter of the filler (D) is within the above mentioned range, the Rayleigh scattering can be suppressed to low level, and the haze value is also suppressed low, thus the total light transmittance can be maintained high.

The average particle diameter of the filler (D) is preferably 1 to 40 nm, and particularly preferably 10 to 30 nm. By having the average particle diameter of the filler (D) within such range, even when the film-like adhesive is thick, the haze value can be suppressed low, and the total light transmittance can be maintained high.

The average particle diameter of the filler (D) shows the volume average particle diameter measured by the laser diffraction/scattering method.

Other Components

As other components, the following components may be mentioned.

(E) Heat Curing Catalyst

The heat curing catalyst is used for regulating the curing speed of the film-like adhesive. As the preferable heat curing catalyst, a tertiary amines such as triethylene diamine, benzyl dimethyl amine, triethanol amine, dimethylaminoethanol, tris(dimethylaminomethyl) phenol or so; imidazols such as 2-methylimidazol, 2-phenylimidazol, 2-phenyl-4-methylimidazol, 2-phenyl-4,5-dihydroxymethylimidazol, 2-phenyl-4-methyl-5-hydroxymethylimidazol or so; organic phosphine such as tributylphosphine, diphenylphosphine, triphenylphosine or so; tetraphenyl borate such as tetraphenylphosphoniumtetraphenyl borate, triphenylphosphinetetraphenyl borate or so may be mentioned. These may be used alone or by mixing two or more thereof.

In case of using the heat curing catalyst (E), the heat curing catalyst (E) is preferably included in an amount of 0.01 to 10 parts by weight, and more preferably 0.1 to 1 parts by weight with respect to 100 parts by weight of epoxy resin (B). By comprising the heat curing catalyst (E) within the above mentioned amount, excellent adhesiveness can be exhibited even when exposed under high temperature high humidity environment, and also high package reliability can be attained even when it is exposed harsh reflow condition. If the content of the heat curing catalyst (E) is little, a sufficient adhesiveness cannot be obtained due to insufficient curing; and if it too much, the heat curing catalyst with high polarity moves toward the adhering boundary face side in the cured film-like adhesive, then segregate thereby the package reliability is lowered.

(F) Coupling Agent

By using the coupling agent having the functional group reacting with the inorganic matter such as the semiconductor wafer or so, and the functional group reacting with the organic functional group comprised in the binder resin (A) and epoxy resin (B) or so, the adhesive force of the film-like adhesive against the adherend can be improved. Also, the water resistance can be improved without compromising the heat resistance of the cured product obtained by curing the film-like adhesive. As for the coupling agent (F), silane coupling agent is preferable.

As for the coupling agent, γ-glycidoxypropyltrimethoxy silane, γ-glycidoxypropylmethyldiethoxy silane, β-(3,4-epoxycyclohexyl)ethyltrimethoxy silane, γ-(methacrylopropyl) trimethoxy silane, γ-aminopropyltrimethoxy silane, N-6-(aminoethyl)-γ-aminopropyltrimethoxy silane, N-6-(aminoethyl)-γ-aminopropylmethyldiethoxy silane, N-phenyl-γ-aminopropyltrimethoxy silane, γ-ureidopropyltriethoxy silane, γ-mercaptopropyltrimethoxy silane, γ-mercaptopropylmethyldimethoxy silane, bis(3-triethoxysilylpropyl)tetrasulphone, methyltrimethoxy silane, methyltriethoxy silane, vinyltrimethoxy silane, vinyltriacetoxy silane, imidazol silane or so may be mentioned. These may be used alone or by mixing two or more thereof.

The content of the coupling agent (F) is usually 0.1 to 20 parts by weight, preferably 0.2 to 10 parts by weight, and more preferably 0.3 to 5 parts by weight. If the content of the coupling agent (F) is less than 0.1 parts by weight, the above mentioned effect cannot be obtained, and if it exceeds 20 parts by weight, it may cause the out gas.

(G) Energy Ray Polymerizable Compound

The film-like adhesive may comprise the energy ray polymerizable compound (G). The energy ray polymerizable compound (G) includes unsaturated hydrocarbon and it polymerize cures when it receives the energy ray irradiation such as ultraviolet ray or electron beam or so. By polymerizing the energy ray polymerizable compound (G) by the energy ray irradiation, the adhesive force of the film-like adhesive agent is lowered. Therefore, the interlayer releasing between the support sheet and the film like adhesive can be carried out easily.

As such energy ray polymerizable compound (G), specifically an acrylate based compound such as trimethylolpropanetriacrylate, pentaerythritoltriacrylate, pentaerythritoltetraacrylate, dipentaerythritolmonohydroxypentaacrylate, dipentaerythritolhexaacrylate or 1,4-butyleneglycoldiacrylate, 1,6-hexanedioldiacrylate, polyethyleneglycoldiacrylate, oligoesteracrylate, urethaneacrylate based oligomer, epoxy modified acrylate, polyetheracrylate and itaconic acid oligomer or so may be mentioned. Such compounds comprise at least one polymerizable double bond in the molecule, and usually the weight average molecular weight is 100 to 30000, preferably 300 to 10000 or so. In case of using the energy ray polymerizable compound (G), the blending amount thereof is not particularly limited, and it is preferable to use at the ratio of 1 to 50 wt % or so against the entire solid portion constituting the film-like adhesive.

(H) Photopolymerization Initiator

In case of blending the energy ray polymerizable compound (G) to the film-like adhesive, the energy ray such as ultraviolet ray or so is irradiated, and the release property of the adhesive layer made of the film-like adhesive from the support sheet can be improved. By comprising the photopolymerization initiator (H) in the film-like adhesive, the time for the curing/polymerization and the irradiation time can be reduced.

As the photopolymerization initiator (H), specifically, benzophenone, acetophenone, benzoin, benzoinmethylether, benzoinethylether, benzoinisopropylether, benoinisobutylether, benzoin benzoic acid, benzoin methyl benzoic acid, benzoindimethylketal, 2,4-diethylthioxanthone, α-hydroxycyclohexylphenylketone, benzyldiphenylsulphide, tetramethylthiurammonosulphide, azobisisobutyronitrile, benzyl, dibenzyl, diacetyl, 1,2-diphenylmethane, 2-hydroxy-2-methyl-1-[4-(1-methylvinyl)phenyl]propanone, 2,4,6-trimethylbenzoyldiphenylphosphineoxide, and β-chloranthraquinone or so may be mentioned. The photopolymerization initiator (H) may be used alone or by combining two or more thereof.

The content of the photopolymerization initiator (H) is preferably 0.1 to 10 parts by weight, more preferably 1 to 5 parts by weight with respect to 100 parts by weight of the energy ray polymerizable compound (G). If the content of the photopolymerization initiator (H) is below said range, a sufficient interlayer releasing may not be attained due to the insufficient photopolymerization. If it exceeds said range, the residue which does not contribute to the photopolymerization is generated, and the curability of the film-like adhesive may be insufficient.

(I) Crosslinking Agent

The crosslinking agent (I) can be added to the film-like adhesive in order to regulate the initial adhesive force thereof and the aggregation force. As the crosslinking agent (I), organic polyvalent isocyanate compound, organic polyvalent imine compound or so may be mentioned.

As for the above mentioned organic polyvalent isocyanate compound, aromatic polyvalent isocyanate compound, aliphatic polyvalent isocyanate compound, alicyclic polyvalent isocyanate compound and the trimer of the organic polyvalent isocyanate compound thereof, and terminal isocyanate urethane pre-polymer obtained by reacting these organic polyvalent isocyanate compounds and the polyol, may be mentioned.

As for specific example of the organic polyvalent isocyanate compound, 2,4-tolylenediisocyanate, 2,6-tolylenediisocyanate, 1,3-xylenediisocyanate, 1,4-xylenediisocyanate, diphenylmethane-4,4'-diisocyanate, diphenylmethane-2,4'-diisocyanate, 3-methyldiphenylmethanediisocyanate, hexamethylenediisocyanate, isophoronediisocyanate, dicyclohexylmethane-4,4'-diisocyanate, dicyclohexylmethane-2-4'-diisocyanate, trimethylolpropane adduct tolylenediisocyanate, and lysine isocyanate or so may be mentioned.

As for the above mentioned organic polyvalent imine compounds, N—N'-diphenylmethane-4,4'-bis(1-aziridinecarboxyamide), trimethylolpopane-tri-β-aziridinylpropionate, tetramethylolmethane-tri-β-aziridinylpropionate, and N,N'-toluene-2,4-bis(1-aziridinecarboxyamide)triethylenemelamine or so may be mentioned.

The crosslinking agent (I) is used in a fraction of preferably 1 to 40 parts by weight, more preferably 8 to 35 parts by weight and particularly preferably 12 to 30 parts by weight with respect to 100 parts by weight of the binder resin (A).

(J) General Additives

Various additives may be blended depending on the needs into the film-like adhesive besides the above described. As for the various additives, a plasticizer, an antistatic agent, an antioxidizer, a flame retardant, a gettering agent, a chain transfer agent or so may be mentioned.

The total light transmittance in D65 standard light source of the film-like adhesive comprising above mentioned components are 70% or more, and the haze value is 50% or less.

If the total light transmittance is less than 70% or the haze value exceeds 50%, when fixing (die bonding) the chip with the film-like adhesive to the substrate or other chip during the production step of the semiconductor wafer, or when fixing the semiconductor chip to the substrate with the film-like adhesive, it becomes difficult to read the alignment (the positioning) of the mark, thus the die bonding cannot be carried out accurately.

The total light transmittance in D65 standard light source of the film-like adhesive is preferably 75 to 100%, and the haze value is preferably 1 to 40%.

The total light transmittance and the haze value of the film-like adhesive can be controlled by regulating the average particle diameter of the filler (D) or the compatibility of each component except the filler (D).

Also, the moisture absorption rate of after the curing of the film-like adhesive is preferably 5% or less, more preferably 3% or less and particularly preferably 0 to 2%. By having the absorption rate of after the curing of the film-like adhesive within the above mentioned range, the package reliability of the semiconductor can be improved. Note that, the moisture absorption rate is the moisture absorption rate measured after 168 hours by the condition and the method described in the following examples.

(Adhesive Sheet for the Semiconductor Junction)

The adhesive sheet for the semiconductor junction according to the present invention is produced by laminating the adhesive layer made of the film-like adhesive comprising the above mentioned components onto the support sheet. The adhesive layer comprises the pressure sensitive adhesiveness or the thermal bonding property, and the thermosetting property. In case the adhesive layer comprises the pressure sensitive adhesiveness, it can be adhered at the non-cured state to the adherend by pressing. Also, in case the adhesive layer comprises the thermal bonding property, it can be adhered by applying a heat to the adhesive layer when pressing to the adherend. The thermal bonding property in the present invention means that it does not have the pressure sensitive property at the normal temperature, but becomes capable to adhere to the adhered by applying heat as it becomes soft. Therefore, the adhesive layer of the adhesive sheet for semiconductor junction of the present invention has a function to temporarily hold various adherend at non-cured state. Therefore, the processing, for example the grinding processing, can be carried out to the face (backside) where the sheet of the adherend is not adhered with the sheet while holding the adherend by the adhesive sheet for the semiconductor junction. Further, the cured product having high impact resistance can be supplied at the end via the thermosetting, and has excellent adhesive strength, and sufficient adhesiveness can be maintained even under the harsh high temperature high humidity condition. The adhesive composition constituting the film-like adhesive is obtained by mixing the above mentioned components in an appropriate ratio. When mixing, each component may be diluted by a solvent in advance, or it may be added to the solvent at the time of mixing.

Hereinafter, the preferable embodiment of the adhesive sheet for the semiconductor junction and the preferable use embodiment thereof will be described. When using the adhesive sheet for the semiconductor junction wherein the adhesive layer is formed on the support sheet in a releasable manner, the adhesive layer is adhered to the adherend such as wafer or the substrate or so, then the support sheet is released, and the adhesive layer is transferred to the adherend. The shape of the adhesive sheet for the semiconductor junction may be tape shape, label shape or so.

The support sheet may be made only by the resin film without the tackiness on the surface, or it may be those carried out with appropriate surface treatment or so to the resin film, and also it may be the pressure sensitive adhesive sheet pressure sensitive adhesive sheet with the pressure sensitive adhesive layer on the resin film or so. Also, a bump absorbing layer may be provided on the resin film.

As the resin film used as the support sheet, for example, polyethylene film, polypropyrene film, polybutene film, polybutadiene film, polymethylpentene film, polyvinyl chloride film, vinyl chloride copolymer film, polyethyleneterephthalate film, polyethylenenaphthalate film, polybutyleneterephthalate film, composite film of urethane polymer and vinyl based polymer, urethane acrylate cured film, ethylene vinyl acetate copolymer film, ionomer resin film, ethylene-(meth)acrylic acid copolymer film, ethylene-(meth)acrylic acid ester copolymer film, polystyrene film, polycarbonate film, polyimide film, fluorine resin film or so may be mentioned. Also, the crosslinking film thereof may be used as well. Further, it may be a laminated film of these. Also, the colored film of these can be used as well. In case the adhesive layer has the energy ray curability, it is preferably those with transparency against the energy ray. Also, in case it is needed to visually verify the surface of the adherend before carrying out the interlayer releasing between the support sheet and the adhesive layer, it is preferable to have transparency (transparent or semi-transparent) against the visible light as well.

Among these, as for the resin film, it is preferable to use the resin film having the storage elastic modulus at 23° C. of preferably $1\times10^7$ Pa or more, and more preferably $1\times10^8$ to $1\times10^9$ Pa. Also, it is preferable to use the resin film having the stress relaxation rate at 23° C. based on the tensile test of preferably 40% or more, and more preferably of 70 to 90%. By using the resin film having the storage elastic modulus and the stress relaxation rate within the above range, the curving of the wafer or the dimple can be suppressed from generating.

Here, the stress relaxation rate at 23° C. based on the tensile test is measured by the below method. The resin film is cut in a size of 15 mm×140 mm to form a sample. By using universal tensile test machine (AUTOGRAPH AG-10kNIS made by Shimadzu Corporation) under the environment of 23° C. and relative humidity of 50%, 20 mm of both ends is held and pulled at the speed of 200 mm per minute. Then the stress A ($N/m^2$) at the 10% stretch and the stress B ($N/m^2$) at after 1 minute from the stop of the tape stretch are measured. From the value of A and B thereof, the stress relaxation rate is calculated from $(A-B)/A\times100$ (%).

The characteristic of such film tends to be easily obtained from the composite film of urethane polymer and vinyl based polymer, or the cured urethane acrylate film. As for the composite film of urethane polymer and vinyl based polymer, those disclosed in JP Patent Application Laid Open 2007-84722 can be used. As for the cured urethane acrylate film, those disclosed in JP Patent Application Laid Open H11-343469 may be used.

The adhesive sheet for semiconductor junction according to the present invention is adhered to various adherends, after carrying out necessary processing to the adherends, the adhesive layer is released from the support sheet while the adherend is still adhered. That is, it is used to the process including the step of transferring the adhesive layer to the adherend from the support sheet. Therefore, the surface tension of the face contacting with the adhesive layer of the support sheet is preferably 40 mN/m or less, more preferably 37 mN/m or less, and particularly preferably 35 mN/m or less. Usually the lower limit is 25 mN/m or so. The support sheet having a low surface tension as such can be obtained by appropriately selecting the material of the resin film, and also it can be obtained by carrying out the release treatment by coating the release agent to the surface of the resin film.

As the release agent used for the release treatment of the resin film, alkyd type, silicone type, fluorine type, unsaturated polyester type, polyolefin type, wax type can be used; however the releasing agent of alkyd type, silicone type and fluorine type is preferably used as it has heat resistance.

In order to carry out the release treatment to the surface of the resin film by using the above mentioned release agent, the release agent is used without the solvent, or by diluting in the solvent or by emulsifying, and coating by gravure coater, Meyer bar coater, air knife coater, or roll coater or so, then the release agent layer is formed by curing the support sheet coated with the release agent by placing at room temperature or applied with a heat, or by electron beam.

Also, the surface tension of the support sheet can be regulated by laminating the film using wet lamination or dry lamination, thermofusion lamination, melt extrusion lamination, coextrusion processing or so. That is, the laminated body is produced by laminating the film wherein the surface tension of at least one face is within the preferable range as the face contacting with the adhesive layer of the above mentioned support sheet, with other film; thereby the support sheet can be made.

The support sheet may be a pressure sensitive adhesive sheet comprising the pressure sensitive adhesive layer on the resin film such as mentioned in the above. In order for the adhesive layer to be releasable from the pressure sensitive adhesive layer, the pressure sensitive adhesive layer can be constituted from the known re-releasable agglutinant. By selecting the agglutinant of ultraviolet ray curable type, heat foaming type, water swelling type or weakly adhesive type or so, the releasing of the adhesive layer can be done easily. Particularly, in case of using composite film made of urethane polymer and vinyl based polymer, or cured urethane acrylate film as the constituting layer of the resin film, since these films are usually flexible and self-adhesive, the interlayer releasing becomes difficult if these are in direct contact with the adhesive layer. Therefore, in order to avoid such trouble, the support sheet is preferably pressure sensitive adhesive sheet.

The pressure sensitive adhesive force of the pressure sensitive adhesive layer is preferably 10 to 10000 mN/25 mm, more preferably 50 to 2000 mN/25 mm. The pressure sensitive adhesive force is the pressure sensitive adhesive force of the pressure sensitive adhesive sheet of after 30 minutes being adhered to the adherend (SUS) and carried out with 180° peeling test, in accordance with JIS Z0237; 2009. By having the pressure sensitive adhesive force of the pressure sensitive adhesive sheet within the above range, the adhesive layer can be easily released from the pressure sensitive adhesive layer.

Also, the storage elastic modulus of the pressure sensitive adhesive layer at 23° C. is preferably $1\times10^4$ Pa or more, and more preferably $1\times10^5$ to $1\times10^8$ Pa. By using the pressure sensitive adhesive layer having the storage elastic modulus within the above mentioned range, the curving of the wafer and the generation of the dimples can be suppressed during the backside grinding step of the wafer.

Also, on the top face of the resin film, which is at the resin film surface of the side where the pressure sensitive adhesive layer is provided, a corona treatment may be carried out or the primer layer may be provided in order to improve the adhesiveness with the pressure sensitive adhesive layer. Also, at the opposite face of the pressure sensitive adhesive layer, various coated films may be coated.

The bump absorbing layer provided on the resin film is formed for example by known various pressure sensitive adhesive layer, and it may be a layer as both of the bump absorbing layer and the pressure sensitive adhesive layer. As the pressure sensitive adhesive layer, it is not particularly limited, and for example, the pressure sensitive adhesive layer of rubber based, acrylic based, silicone based, polyvinylether or so may be used. Also, the pressure sensitive adhesive layer of energy ray curable type, heat foaming type and water swelling type or so can be used as well. Also, the composite film between urethane polymer and vinyl based polymer, or the cured urethane acrylate film may be used as the bump absorbing layer. Further, the pressure sensitive adhesive layer can be further provided on the bump absorbing layer made of the composite film between urethane polymer and vinyl based polymer, or the cured urethane acrylate film. Note that, in case the support sheet comprises plurality of composite film between urethane polymer and vinyl based polymer, or cured urethane acrylate film, except for those at the position furthest from the pressure sensitive adhesive layer, the composite film between urethane polymer and vinyl based polymer, or the cured urethane acrylate film will be considered bump absorbing layer.

As for the composite film between urethane polymer and vinyl based polymer, or the cured urethane acrylate film, those mentioned in the above can be used. Furthermore, as the cured urethane acrylate film, it may be the bump absorbing layer wherein the sheet made by curing the energy ray curable composition comprising urethane acrylate based oligomer and compound comprising thiol group in the molecule is stacked on the resin film as disclosed in JP Patent Application Laid Open No 0.2011-068727.

The storage elastic modulus of the bump absorbing layer at 23° C. is preferably $1\times10^4$ Pa or more, and more preferably $3\times10^5$ to $3\times10^6$ Pa. Also, the stress relaxation rate of the bump absorbing layer after 10 seconds of applying 20% torsional stress is preferably 50% or more, and more preferably 80 to 99.9%. By using the bump absorbing layer having the storage elastic modulus and the stress relaxation rate within the above mentioned ranges, even if the projections having the height of several tens μm or so are formed on the face where the adhesive sheet for the semiconductor junction of the wafer is adhered, the projections are absorbed by the bump absorbing layer, and the surface of the adhesive sheet for the semiconductor junction can be maintained flat. Also, even in case that the thickness of the adhesive layer is thinner than the height of such projections, the bump absorbing layer absorbs the projections which has penetrated through the adhesive layer, thereby the adhesive layer approaches/reaches to the wafer surface, thus the adhesive layer can be adhered to the wafer surface.

Also, the adhesive sheet for the semiconductor junction may have a shape that the support sheet and the adhesive sheet is cutout in the same shape as the adherend (the semiconductor wafer or so) in advance. Particularly, it may be a shape wherein the laminated body made of support sheet and the adhesive layer is continuously held on the long processing film. As the processing film, the resin film which as mentioned as the example of the resin film can be used.

The thickness of the support sheet is usually 10 to 500 μm, preferably 15 to 300 μm, and particularly preferably 20 to 250 μm or so. In case the support sheet is the pressure sensitive adhesive sheet, usually the layer made of the agglutinant occupies the thickness of 1 to 50 μm or so of the thickness of the support sheet. Also, in case the bump absorbing layer is provided, usually the bump absorbing layer occupies the thickness of 10 to 450 μm or so of the support sheet. Also, the thickness of the adhesive layer is usually 2 to 500 μm, preferably 6 to 300 μm, and particularly preferably 10 to 150 μm or so. The thickness of the adhesive layer is preferably approximately the same as the height of the projections formed on the wafer to be adhered.

At the adhesive sheet for the semiconductor junction, in order to protect the adhesive layer before the use, the release film may be laminated on the top face of the adhesive layer. As the release film, those coated with the release agent such as silicone resin or so to the plastic material such as polyethyleneterephthalate film or polypropylene film or so may be used.

The production method of the adhesive sheet for the semiconductor junction is not particularly limited; and in case the support sheet is the resin film, the adhesive composition is coated and dried on the resin film to form the adhesive layer, thereby producing the adhesive sheet for the semiconductor junction. Also, it may be produced by providing the adhesive layer on the release film and transferring this to the above mentioned resin film or agglutinant sheet. Also, the adhesive sheet for the semiconductor junction can be cut by punching process so that the shape is same as the wafer shape which is adhered to the adhesive layer, or the shape having larger concentric than the wafer.

Next, the method of use of the adhesive sheet for the semiconductor junction according to the present invention will be explained by using the example applying the adhesive sheet to the production of the semiconductor device by adhering to the wafer.

(The Production Method of the Semiconductor Device)

The production method of the semiconductor device according to the present invention comprises the step of adhering the adhesive layer of the above mentioned adhesive sheet for the semiconductor junction to the wafer, the step of obtaining the chip by dicing the wafer, and the step of fixing the chip via the adhesive layer.

Hereinbelow, a part of the examples of the production method of the semiconductor wafer according to the present invention will be described in detail.

In the first production method of the semiconductor device according to the present invention, firstly the adhesive sheet for the semiconductor junction is adhered to the circuit face of the semiconductor wafer formed with the circuit on the surface. When adhering, the circuit face of the semiconductor wafer is placed on the adhesive layer of the adhesive sheet for the semiconductor junction, and lightly pressed, then in some case while applying heat, the adhesive layer is softened, thereby the semiconductor may be fixed. Next, depending on the needs, while the circuit face of the semiconductor wafer is protected by the adhesive sheet for the semiconductor junction, the backside of the wafer is ground and the wafer having a predetermined thickness is formed.

The semiconductor wafer can be silicon wafer, or it may be a compound semiconductor wafer such as gallium-arsenic. The circuit is formed on the wafer surface by various methods including the conventionally widely used method such as an etching method, a lift off method or so. In the circuit forming step of the semiconductor wafer, the predetermined circuit is formed. The thickness of such wafer of before grinding is not particularly limited, however usually it is 500 to 1000 μm or so. Also, the surface shape of the semiconductor wafer is not particularly limited, and the projection like electrodes may be formed. As the projection like electrodes, columnar shape electrodes, spherical electrodes or so may be mentioned. Also, it may be the semiconductor wafer comprising the through-silicon via. The method of adhering the adhesive sheet for the semiconductor junction to the semiconductor wafer is not particularly limited.

The backside grinding is performed by known methods using the grinder and the vacuum table or so for the wafer step while the adhesive sheet for semiconductor junction is still adhered. After the backside grinding step, the treatment to remove the fractured layer generated due to the grinding may be performed. The thickness of the semiconductor wafer of after the backside grinding is not particularly limited, and preferably it is 10 to 400 μm, more preferably 25 to 300 μm. According to the adhesive sheet for the semiconductor junction of the present invention, the wafer is securely held during the backside grinding of the wafer, and can prevent the penetration of the grinding water into the circuit surface, furthermore, the curving of the wafer and the generation of the dimple or so can be prevented.

After the backside grinding, the pressure sensitive adhesive sheet so called dicing sheet is adhered to the backside of the wafer. The adhering of the dicing sheet is carried out in general by the device called mounter, but it is not particularly limited. Next, only the support sheet is released while the adhesive layer is still remained on the circuit surface of the wafer. The method of releasing the support sheet is not particularly limited.

Then, the dicing of the wafer adhered with the dicing sheet is carried out, and the wafer is diced, thereby the chip is obtained.

The cutting means of the semiconductor wafer is not particularly limited. As one example, the method of forming chips of a wafer by known methods such as a method using a rotating round blade of dicer or so after fixing the peripheral portion of the dicing sheet by the ring flame when cutting the wafer may be mentioned. At this time, the depth of the cut is set to the depth considering the total thickness of the adhesive layer and the semiconductor wafer, and the abrasion portion of the dicing saw. Also, the adhesive layer and the wafer may be cut by the laser beam.

Next, depending on the needs, by carrying out the expansion of the dicing sheet, the space between the semiconductor chips enlarges and the pickup of the semiconductor chip can be carried out further easier. Here, the chip and the dicing sheet slide against each other, and the adhesive force between the chip and the dicing sheet declines, and the pickup property of the semiconductor chip improves. By carrying out the pickup of the semiconductor chip as such, the adhesive layer being cut can be released from the dicing sheet while leaving the adhesive layer on the semiconductor chip circuit face.

Next, the bonding step (die bonding) of the semiconductor chip is carried out. During the boding step, the semiconductor chip is mounted on the die pad of the lead frame or on other semiconductor chip (lower chip) surface via the adhesive layer (hereinafter, the die pad or the lower chip surface where the chip is to be mounted will be referred as "chip mounting part"). In the present invention, since the total light transmittance and the haze value of the adhesive layer adhered on the surface of the semiconductor chip is within the predetermined value, the alignment mark on the chip surface during the die bonding can be easily read. As a result, the semiconductor chip can be accurately die bonded to the chip mounting part. The chip mounting part may be applied with heat before mounting the semiconductor chip, or it may be applied with heat immediately after mounting the chip. The temperature of the heat applying is usually 80 to 200° C., and preferably 100 to 180° C.; and the heat applying time is usually 0.1 second to 5 minutes, and preferably 0.5 seconds to 3 minutes; and the pressure when mounting is usually 1 kPa to 200 MPa.

After mounting the semiconductor chip on the chip mounting part, depending on the needs, the adhesive layer may be cured by applying the heat which is separate from the curing of the adhesive layer using the heat applying for the resin sealing as mentioned in below. Here, the heat applying condition is within the range of the above mentioned heat applying temperature, and the heat applying time is usually 1 to 180 minutes, and preferably 10 to 120 minutes.

Also, it may be temporarily adhered without carrying out the heat applying after the mounting, and the adhesive layer may be cured by using the heat applying for the resin sealing which is usually carried out for the package production. By going through such step, the adhesive layer cures, and the semiconductor chip and the chip mounting part is firmly adhered, and the chip may be fixed. The adhesive layer s fluidized under the die bonding condition, thus it is sufficiently embedded into the unevenness of the chip mounting part, thus the void is prevented from being generated, and the package reliability increases.

In the second production method according to the present invention, as similar to the above mentioned first production method, the adhesive sheet for the semiconductor junction is adhered to the circuit face of the semiconductor wafer, and then the backside of the wafer is ground. After the backside grinding, the treatment to remove the fractured layer due to the grinding may be performed.

After the backside grinding, the laser beam is irradiated to the inside of the wafer from the backside of the wafer. The laser beam is irradiated from the laser beam source. The laser beam source is a device which generates the light with matching wavelength and phase; and as for the type of the laser beam, Nd-YAG laser, Nd-YVO laser and Nd-YLF laser which generates pulse laser beam, and those generates multiphoton absorption such as titanium-sapphire laser or so may be mentioned. The wavelength of the laser beam is 800 to 1100 nm is preferable, and 1064 nm is further preferable.

The laser beam is irradiated to the inside of the wafer; the reformed part is formed inside the wafer along the planned cut line. The number of the laser beam for scanning one planned cut line may be once or it may be plurality of time. Preferably, the irradiating position of the laser beam and the position of the planned cut line between the circuits are monitored, and the laser beam is irradiated while correcting the position of the laser beam. Note that, the planned cut line is an imaginary line which divides each circuits formed on the wafer surface.

After forming the reformed part, the dicing sheet is adhered to the wafer backside. Next, the adhesive layer is left on the circuit face of the wafer and only the support sheet is released. Then, the dicing of the wafer adhered on the dicing sheet is carried out, thereby the chip is obtained by the dicing of the wafer. The semiconductor wafer is made into chips by expanding the dicing sheet. That is, when the expanding is carried out after the reformed part is formed at the inside of the wafer by the laser beam irradiation, the dicing sheet is stretched, and the semiconductor wafer cut and separated into each chip from the reformed part of inside of the wafer. Here, the adhesive layer is also cut and separated into each chip size. Also, the wafer and the chip may be possible to cut and separate into each chip by stretching the dicing sheet, by scratching the dicing sheet using the jigs or so simultaneously as expanding. It is preferable to carry out the expanding under the environment of −20 to 40° C., and at the speed of 5 to 600 mm/min. Also, in order to overcome the dicing sheet which has been expanded from becoming loose after the expanding step, a heat shrink may be carried out. Then, the chip comprising the adhesive layer on the surface is picked up, and the semiconductor device is produced via the bonding step. The bonding step is the same as the above mentioned first production method.

The first and the second production method described in above is merely a part of the example of the production method of the present invention, and the production method of the present invention may take other embodiment. For example, the film-like adhesive may be adhered alone on the wafer without using the sheet for the semiconductor junction, and the protection sheet for backside grinding of the wafer may be adhered separately on other film-like adhesive.

Also, it may be a production method wherein the backside grinding of the wafer is completed before the film-like adhesive or the adhesive sheet for the semiconductor junction is being adhered, and that the backside grinding will not be carried out after the film-like adhesive or the adhesive sheet for the semiconductor junction is adhered.

Also, the dicing method of the wafer may be a so called pre-dicing method wherein the groove with the depth smaller than the thickness of the wafer is formed from the surface side of the wafer, and dicing by grinding the backside of the wafer until it reaches to the groove; or it may be the dividing method wherein the step of grinding the backside of the wafer is added to the step of forming the reformed area inside the wafer by entering the laser beam from the surface of the wafer by corresponding to the shape of the chip.

As obvious from the production method of the above mentioned semiconductor device, the adhesive sheet for the semiconductor junction according to the present invention can be used as back grinding-die bonding sheet which can be used to the bonding step of the chip from the backside grinding of the wafer.

EXAMPLE

Hereinafter, the present invention will be explained using the examples and the comparative examples; however the present invention is not to be limited thereto. Note that, in the examples and the comparative examples hereinbelow, each evaluation was carried out as described in the following.

<The Haze Value and the Total Light Transmittance>

Using the adhesive compositions (1) to (5), each adhesive composition was coated to the release film (SP-PET 381031 made by Lintec Corporation), and dried (for 1 minute at 100° C. in an oven), thereby the film-like adhesive having the thickness of 20 μm was produced. Also, the film-like adhesive having the thickness of 20 μm was produced separately, and then by laminating the film-like adhesive, the film-like adhesive having the thickness of 40 μm, 60 μm, 80 μm, and 100 μm were obtained. Next, the release film was released to make the evaluation sample. By using a haze meter (NDH-5000 made by NIPPON DENSHOKU INDUSTRIES Co., LTD), the haze value (%) of the film-like adhesive of the evaluation sample was measured in accordance with JIS K7136:2000. Also, the total light transmittance (%) in D65 standard light source of the film-like adhesive of the evaluation sample was measured in accordance with JIS K7361:2000.

<The Moisture Absorption Rate>

The film-like adhesive (50 mm square) produced by using the adhesive compositions (1) to (5) were laminated to form the thickness of 200 μm to obtain the laminated sheet, and formed the evaluation sample. The evaluation sample was cured in the oven for 1 hour at 140° C., and then introduced in a heat and humidity condition (85° C., relative humidity 85%) for a predetermined time (24 hours and 168 hours). Then, the weight change (%) of the cured product before and after the introduction was measured, and the moisture absorption rate after 24 hours and 168 hours were obtained.

<The Alignment>

8 inch wafer made by WALTS CO., LTD. "WALTS-TEG MB50-0101JY_TYPE_B (with polyimide film), thickness of 725 μm" were prepared. 544 pads are present on each of the planned dicing area formed on this wafer. To each of these pads, Cu pillar having the height of 30 μm was produced, then SnAg solder having the height of 15 μm was provided on this Cu pillar to form the bump having the total height of 45 μm. The evaluation wafer simulating the flip chip type wafer was prepared as discussed in above.

To the bump provided face of the evaluation wafer, the adhesive sheet for the semiconductor junction obtained in the examples and the comparative examples were laminated using Fully-Automatic Back Grind Tape Laminator (RAD-3510F/12 made by Lintec Corporation).

Next, by using the wafer back grind device (DGP8760 made by DISCO Corporation), the polishing and dry polishing treatment were carried out to obtain the wafer having the thickness of 300 μm.

Then, by using Fully-Automatic Multifunction Wafer Mounter (RAD-2700F/12 made by Lintec Corporation), ultraviolet (UV) ray curable dicing tape (Adwill D-678 made by Lintec Corporation) was adhered to the dry polish face, and fixed to the ring frame.

Then, by the same device, the support sheet of the adhesive sheet for the semiconductor junction was released, and the adhesive layer was exposed. Then, the dicing was carried out by using the fully automatic dicing saw (DFD651 made by DISCO Corporation), thereby the chip was diced (7.3 mm×7.3 mm).

To the dicing tape adhered with the aligned chip, by using Semi-Automatic UV irradiation System (RAD-2000 m/12 made by Lintec Corporation), the UV irradiation was carried out (the illumination of 230 mW/cm$^2$, the luminous energy 180 mJ/cm$^2$, under nitrogen atmosphere), the pressure sensitive adhesive force of the dicing tape was lowered. Then, the chip adhered with the adhesive layer was released from the dicing tape manually, then in order to prevent the adhering, it was placed in the chip tray of which the release film (SP-PET 381031 made by Lintec Corporation) is adhered to the chip housing part bottom face so that the adhesive layer side faces down.

By using the flip chip bonder (product name "FB30T-M" made by Panasonic Corporation), the diced chip with the adhesive layer was taken out of the chip tray, and it was evaluated whether the pattern was recognized or not at the bump provided face (the face adhered with the adhesive layer) thereof. The test was carried out to 10 chips, and if the pattern was recognized for all 10 chips, then it was evaluated "A"; for those of 6 to 9 it was evaluated "B"; and for those of 5 or less it was evaluated "C".

[The Example of the Production of the Film-Like Adhesive]

Each component of the adhesive compositions (1) to (5) constituting the film-like adhesive are as described in below and as shown in Table 1. In accordance with the components of below described and the blending amount shown in Table 1, each component was blended and the adhesive compositions (1) to (5) were prepared. In Table 1, the value of each component is shown in parts by weight in terms of the solid portion, and in the present invention, the solid portion refers to entire components except for the solvent.

(A) Acrylic polymer: acrylic polymer (weight average molecular weight: 900000, the glass transition temperature: −28° C.) comprising 55 parts by weight of n-butyl acrylate, 10 parts by weight of methylacrylate, 20 parts by weight of glycidyl methacrylate and 15 parts by weight of 2-hydroxyethyl acrylate (B-1) Epoxy resin: bisphenol A type epoxy resin (jER 828, epoxy equivalent: 235 g/eq, manufactured by Japan Epoxy Resins Co., Ltd.)

(B-2) Epoxy resin: Novolak type epoxy resin (EOCN-104S, epoxy equivalent: 218 g/eq, made by Nippon Kayaku Co., Ltd.)

(C) Thermosetting agent: Novolak type phenol resin (TD-2131, phenolic hydroxyl group equivalent: 103 g/eq, made by DIC Corporation)

(D1) Filler: Silica filler (MEK-ST, average particle diameter: 10 to 15 nm, made by NISSAN CHEMICAL INDUSTRIES, LTD.)

(D2) Filer: Silica filler (YA050C-MJE, average particle diameter: 50 nm, made by Admatechs.)

(D3) Filler: Silica filler (ADMAFINE SC2050, average particle diameter: 500 nm, made by Admatechs.)

(D4) Filler: Carbon black (#MA650, average particle diameter: 28 nm, made by Mitsubishi Chemical Corporation)

(E) Curing accelerator: 2-phenyl-4,5-dihydroxymethyl imidazole (Curezol 2PHZ-PW made by SHIKOKU CHEMICALS CORPORATION.)

(F) Coupling agent: Silane coupling agent (KBE-403, made by Shin-Etsu Chemical Co., Ltd.)

TABLE 1

| | Adhesive composition | | | | |
|---|---|---|---|---|---|
| | (1) | (2) | (3) | (4) | (5) |
| A | 100 | 100 | 100 | 100 | 100 |
| B 1 | 90 | 90 | 90 | 90 | 90 |
| B 2 | 90 | 90 | 90 | 90 | 90 |
| C | 80 | 80 | 80 | 80 | 80 |
| D 1 | 50 | | | | |
| D 2 | | 50 | | | |
| D 3 | | | 50 | | |
| D 4 | | | | 50 | |
| E | 1 | 1 | 1 | 1 | 1 |
| F | 3 | 3 | 3 | 3 | 3 |

The film-like adhesive was formed using the above mentioned adhesive compositions (1) to (5), and each evaluation was carried out. The results are shown in Table 2.

TABLE 2

| | | Adhesive composition | | | | |
|---|---|---|---|---|---|---|
| | | (1) | (2) | (3) | (4) | (5) |
| Haze value (%) | 20 μm | 9.5 | 14.2 | 75.9 | 100 | 9.8 |
| | 40 μm | 19.9 | 24.4 | 93.9 | 100 | 20 |
| | 60 μm | 24 | 31.6 | 97.6 | 100 | 25.5 |

TABLE 2-continued

|  |  | Adhesive composition | | | | |
|---|---|---|---|---|---|---|
|  |  | (1) | (2) | (3) | (4) | (5) |
|  | 80 μm | 29.2 | 38.1 | 99.3 | 100 | 32 |
|  | 100 μm | 33.2 | 45.4 | 99.5 | 100 | 38.2 |
| Total light transmittance (%) | 20 μm | 88.3 | 85.2 | 83.6 | 0 | 88.3 |
|  | 40 μm | 84.7 | 81.3 | 73.2 | 0 | 84.1 |
|  | 60 μm | 82 | 79.1 | 66.2 | 0 | 81.7 |
|  | 80 μm | 79.9 | 73.4 | 59.7 | 0 | 78.5 |
|  | 100 μm | 78 | 72.5 | 56 | 0 | 77 |
| Moisture absorption rate (%) | 24 hours | 1.3 | 1.3 | 1.4 | 1.5 | 1.7 |
|  | 168 hours | 1.5 | 1.7 | 2 | 2.1 | 2.6 |

Example 1

The photocurable resin composition was obtained by blending 50 parts by weight of urethane acrylate based oligomer having the weight average molecular weight of 5000 (made by Arakawa Chemical Industries, Ltd.), 50 parts by weight of isobornyl acrylate, 2.0 parts by weight of photopolymerization initiator (IRGACURE 184 made by Nihon Ciba-Geigy K.K.), 0.2 parts by weight of phthalocyanine based pigment. The obtained resin composition was coated, by a fountain die method, on PET film (SP-PET381031, made by Lintec Corporation) which has been release treated as the cast processing sheet so that the thickness is 110 μm, thereby the resin composition layer was formed. Immediately after the coating, the same PET film being release treated was further laminated on the resin composition layer, then using the high pressure mercury lamp (160 W/cm, height of 10 cm), the resin composition layer was crosslinked and cured by irradiating the ultraviolet ray under condition of the luminous energy of 250 mJ/cm$^2$, thereby resin film having the thickness of 110 μm held between the two release films were obtained.

Next, other release film (SP-PET381031, made by Lintec Corporation) was prepared separately. The coating liquid for forming the pressure sensitive adhesive layer was prepared by adding 20 parts by weight of isocyanate based crosslinking agent (CORONATE L made by NIPPON POLYURETHANE INDUSTRY Co., Ltd.) to 100 parts by weight of toluene solution having 40 wt % concentration of acrylic acid ester copolymer of the weight average molecular weight of 700000 in which 2-ethylhexyl acrylate, methyl methacrylate, 2-hydroxyethyl acrylate is polymerized in the weight ratio of 80:10:10. This coating liquid for forming the pressure sensitive adhesive layer was coated on the release treated face of other release film so that the thickness after drying is 10 nm, and dried for 2 minutes at 80° C., followed by 1 minutes drying at 100° C., thereby the pressure sensitive adhesive layer formed on other release film was obtained.

This pressure sensitive adhesive layer was transferred to the resin film, and the cast processing sheet was removed, then left for 14 days storage under the atmosphere of 23° C. and the relative humidity of 50%, thereby the pressure sensitive adhesive sheet (the support sheet 1) was obtained.

The adhesive composition (1) was diluted by methylethyl ketone so that the solid portion concentration is 50 wt %, and coated and dried (the drying condition: 100° C. for 1 minute in the oven) on the release film (SP-PET381031, made by Lintec Corporation) treated with the silicone so that the thickness after drying is 20 μm, thereby film-like adhesive formed on the release film was obtained. Said procedure was repeated and the film-like adhesive having the thickness of 20 μm after the drying which is formed on other release film was obtained. Then, the obtained film-like adhesive was laminated and the film-like adhesive having the thickness of 40 μm was formed.

Then, the film-like adhesive and the pressure sensitive adhesive layer of the pressure sensitive adhesive sheet exposed by removing other release film from the above mentioned pressure sensitive adhesive sheet were adhered, and by transferring the film-like adhesive to the pressure sensitive adhesive sheet, the desired adhesive sheet for the semiconductor junction was obtained. Each evaluation result is shown in Table 3.

Example 2

Terminal isocyanate urethane prepolymer obtained by polymerizing 33 g of polypropylene glycol (hereinafter PPG4000) having the weight average molecular weight of 4000 and 5 g of isophorone diisocyanate, were reacted with 10 g of pentaerythritol triacrylate.

100 g (solid portion) of obtained urethane acrylate based oligomer, 66.7 g of isobornyl acrylate as the diluting monomer, and 0.83 g of 2-hydroxy-2-methyl-1-phenyl propane-1-one (made by Ciba Specialty Chemical: DAROCUR 1173, the solid portion concentration of 100 wt %), 39.2 g (80.2 mmol) of pentaerythritol tetrakis(3-mercaptopropionate) (made by SAKAI CHEMICAL INDUSTRY CO., LTD.: PEMP, the solid portion concentration of 100 wt %) were added, thereby the liquid energy ray curable composition at the normal temperature was obtained.

On to PET film carried out with the release treatment which is the cast processing sheet (SP-PET381031, made by Lintec Corporation), the above mentioned energy ray curable composition was coated by a fountain die method so that the thickness is 90 μm to form the curable composition layer. Then, ultraviolet ray was irradiated from the curable composition layer side. As the ultraviolet ray irradiating device, belt conveyor type ultraviolet ray irradiator (ECS-401GX made by EYE GRAPHICS Co., Ltd.) and the high pressure mercury lamp (H04-L41 made by EYE GRAPHICS Co., Ltd.) for the ultraviolet light source was used {the irradiation condition: the height of the lamp 150 mm, the lamp output 3 kW (the output conversion 120 mW/cm), the illumination at the light wavelength 365 nm of 271 mW/cm$^2$, the luminous energy of 177 mJ/cm$^2$ (ultraviolet ray actionmeter made by OAK Corporation: UV-351)}. Then, on the curable composition layer of immediately after the irradiation, the resin film of the example 1 was adhered, and the ultraviolet ray irradiation was further carried out for twice from the resin film side, thereby the composition was crosslinked and cured {the irradiation condition: the height of the lamp 150 mm, the lamp output of 3 kW (the output conversion of 120 mW/cm), the illumination at the light wavelength 365 nm of 271 mW/cm$^2$, the luminous energy 600 mJ/cm2 (ultraviolet ray actionmeter made by OAK Corporation: UV-351)}. Next, PET film being release treated was released, and the resin film laminated with the bump absorbing layer of the thickness of 90 μm was obtained.

To the bump absorbing layer of this laminated body, the pressure sensitive adhesive layer of the example 1 was transferred, then left for 14 days storage under the atmosphere of 23° C. and the relative humidity of 50%, thereby the pressure sensitive adhesive sheet with the bump absorbing layer (the support sheet 2) was obtained.

Next, the film-like adhesive having the thickness of 20 μm was laminated, and the film-like adhesive was obtained as same as the example 1 except for the thickness was made to 100 μm, then the adhesive sheet for the semiconductor junction was obtained by transferring to the pressure sensitive adhesive layer of the pressure sensitive adhesive sheet with the bump absorbing layer. The results are shown in Table 3.

Example 3

The adhesive sheet for the semiconductor junction was obtained as same as the example 1 except for using the adhesive composition (2). The results are shown in Table 3.

Example 4

The adhesive sheet for the semiconductor junction was obtained as same as the example 2 except for using the adhesive composition (2). The results are shown in Table 3.

Example 5

The adhesive sheet for the semiconductor junction was obtained as same as the example 1 except for using low density polyethylene film (the support sheet 3) having the thickness of 100 μm as the support sheet. The results are shown in Table 3.

Comparative Example 1

The adhesive sheet for the semiconductor junction was obtained as same as the example 1 except for using the adhesive composition (3). The results are shown in Table 3.

Comparative Example 2

The adhesive sheet for the semiconductor junction was obtained as same as the example 1 except for using the adhesive composition (4). The results are shown in Table 3.

TABLE 3

|  | Examples | | | | | Comparative examples | |
| --- | --- | --- | --- | --- | --- | --- | --- |
|  | 1 | 2 | 3 | 4 | 5 | 1 | 2 |
| Adhesive composition | (1) | (1) | (2) | (2) | (1) | (3) | (4) |
| Support sheet | 1 | 2 | 1 | 2 | 3 | 1 | 1 |
| Adhesive layer thickness (μm) | 40 | 100 | 40 | 100 | 40 | 40 | 40 |
| Alignment | A | A | A | B | A | C | C |

According to the above result, the adhesive sheet for the semiconductor junction of the present invention has excellent alignment during the die bonding. Also, the adhesive composition (5) which does not have the filler (D) has poor moisture absorption rate compared to other adhesive composition.

The invention claimed is:

1. A film-like adhesive comprising a binder resin (A), an epoxy resin (B), a thermosetting agent (C) and a filler (D), wherein a total light transmittance in D65 standard light source is 70% or more, and haze value is 50% or less.

2. The film-like adhesive as set forth in claim 1 comprising 5 wt % or more of the filler (D).

3. The film-like adhesive as set forth in claim 1, wherein an average particle diameter of the filler (D) is 50 nm or less.

4. The film-like adhesive as set forth in claim 1, wherein said binder resin (A) comprises an acrylic polymer comprising 5 to 30 wt % of constituting unit derived from epoxy group containing monomer.

5. The film-like adhesive as set forth in claim 1, wherein a content of the epoxy resin (B) comprises 50 to 1000 parts by weight with respect to 100 parts by weight of the binder resin (A).

6. An adhesive sheet for semiconductor junction wherein the film-like adhesive as set forth in claim 1 is formed as an adhesive layer on a support sheet in a releasable manner.

7. The adhesive sheet for semiconductor junction as set forth in claim 6, wherein the support sheet comprises composite film made of urethane polymer and vinyl based polymer, or comprises cured urethane acrylate film as a constituting layer.

8. A production method of a semiconductor device using the film-like adhesive as set forth in claim 1, wherein said production method comprises:
adhering the film-like adhesive or the adhesive layer of the adhesive sheet for the semiconductor junction to a wafer,
obtaining a chip by dicing the wafer, and
fixing the chip via the film-like adhesive or the adhesive layer.

9. A production method of a semiconductor device using the adhesive sheet for a semiconductor junction as set forth in claim 6, wherein said production method comprises:
adhering the film-like adhesive or the adhesive layer of the adhesive sheet for the semiconductor junction to a wafer,
obtaining a chip by dicing the wafer, and
fixing the chip via the film-like adhesive or the adhesive layer.

* * * * *